United States Patent
Cala et al.

[11] Patent Number: 5,958,144
[45] Date of Patent: *Sep. 28, 1999

[54] FLUX-REMOVING AQUEOUS CLEANING COMPOSITION AND METHOD OF USE

[75] Inventors: Francis R. Cala, Highland Park; Richard A. Reynolds, Highstown, both of N.J.

[73] Assignee: Church & Dwight, Prineton, N.J.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/859,080

[22] Filed: May 20, 1997

Related U.S. Application Data

[60] Provisional application No. 60/020,575, Jun. 26, 1996.

[51] Int. Cl.$^6$ ............................... B08B 3/02; B08B 3/08; C11D 1/825
[52] U.S. Cl. ............................... 134/2; 134/39; 510/175; 510/422; 510/423; 510/433; 510/178
[58] Field of Search ..................... 510/175, 176, 510/256, 255, 254, 422, 423, 509, 433; 134/38, 40, 42, 39, 2; 437/225

[56] References Cited

U.S. PATENT DOCUMENTS

| | | | |
|---|---|---|---|
| 3,930,963 | 1/1976 | Polichette et al. | 204/15 |
| 4,156,619 | 5/1979 | Griesshammer | 134/2 |
| 4,568,395 | 2/1986 | Nabhani | 148/23 |
| 4,670,247 | 6/1987 | Scialpi | 424/484 |
| 5,093,031 | 3/1992 | Login et al. | 252/357 |
| 5,128,057 | 7/1992 | Bixenman et al. | 252/162 |
| 5,234,505 | 8/1993 | Winston et al. | 134/40 |
| 5,234,506 | 8/1993 | Winston et al. | 134/40 |
| 5,261,967 | 11/1993 | Winston et al. | 134/42 |
| 5,264,046 | 11/1993 | Winston et al. | 134/42 |
| 5,264,047 | 11/1993 | Winston et al. | 134/42 |
| 5,297,721 | 3/1994 | Schneider et al. | 228/180.1 |
| 5,308,402 | 5/1994 | Bixenman et al. | 134/2 |
| 5,431,847 | 7/1995 | Winston et al. | 252/174.24 |
| 5,433,885 | 7/1995 | Winston et al. | 252/174.24 |
| 5,456,760 | 10/1995 | Goehausen | 134/42 |
| 5,466,389 | 11/1995 | Ilardi et al. | 252/156 |
| 5,558,109 | 9/1996 | Cala et al. | 134/42 |
| 5,593,504 | 1/1997 | Cala et al. | 134/1 |
| 5,593,507 | 1/1997 | Inada et al. | 134/11 |
| 5,614,027 | 3/1997 | Dunn et al. | 134/2 |
| 5,650,385 | 7/1997 | Dunn et al. | 510/245 |
| 5,688,753 | 11/1997 | Cala et al. | 510/175 |

FOREIGN PATENT DOCUMENTS

| | | |
|---|---|---|
| 5331489 | 12/1993 | Japan . |
| 6017096 | 1/1994 | Japan . |
| 6145081 | 5/1994 | Japan . |
| 96/09366 | 3/1996 | WIPO . |
| 96/09368 | 3/1996 | WIPO . |

OTHER PUBLICATIONS

Kirk–Othmer, Encyclopedia of Chemical Technology, 3rd ed., John Wiley & Sons, vol. 22, pp. 332 and 333, 1983. Month not known.

*Primary Examiner*—Yogendra Gupta
*Assistant Examiner*—Gregory E. Webb
*Attorney, Agent, or Firm*—Irving Fishman

[57] ABSTRACT

A flux-removing, aqueous cleaning composition contains: (A) a solvent phase consisting essentially of water; and (B) a flux-removing phase containing an alkaline salt component and a surfactant formulation, the alkaline salt component containing at least one alkali metal salt, and the surfactant formulation containing at least one fluorinated surfactant and at least one N-alkylpyrrolidone surfactant. A method of removing rosin flux residues from a substrate, preferably a substrate of an electronic circuit assembly, involves (a) cleaning the substrate with the above-described aqueous cleaning composition for a period of time sufficient to substantially emulsify the soldering rosin flux residues to form emulsified rosin flux residues; and (b) removing the emulsified rosin flux residues from the substrate.

10 Claims, No Drawings

FLUX-REMOVING AQUEOUS CLEANING COMPOSITION AND METHOD OF USE

The present application is a non-provisional application of U.S. provisional application Ser. No. 60/020,575 filed Jun. 26, 1996.

BACKGROUND OF THE INVENTION

This invention relates to aqueous cleaning compositions and methods of using same to remove rosin flux residues from substrates. More particularly, this invention relates to aqueous cleaning compositions containing alkaline salts and a particular surfactant formulation which includes fluorinated surfactants and N-alkylpyrrolidone surfactants, and methods of using such compositions to remove rosin flux residues from substrates of electronic circuit assemblies.

In the electronics industry, electrical components such as resistors, capacitors, inductors, transistors, integrated circuits, chip carriers and the like, are typically mounted on circuit boards in one of two ways. In one way, the electronic components or modules are designed to mount to the printed circuit boards (PCBs) by means of plated through-holes in which the metal leads of the modules are spaced apart and sized to fit into corresponding plated through-holes and extend a small distance beyond the undersurface of the PCB. An alternative to the through-hole technique for mounting electronic modules on PCBs is surface mount technology (SMT) wherein the leads of electronic modules are soldered to metal pads plated on the surface of a printed wiring board. In this technique, a solder paste is applied to the metal pads and subsequently the electronic components are precisely placed on the PCB such that the coplanar leads of the module contact corresponding pads on the circuit board which are coated with a layer of solder paste. The solder paste comprises a soft solder alloy typically in a powder form and dispersed in a liquid medium conventionally containing a fluxing composition, an organic solvent and a thickening agent which provides the desired viscous or paste-like consistency to the solder formulation. The solder paste typically has sufficient adhesive strength to hold the components in position until the solder is melted. After application of the solder paste and placement of the electronic components, the entire PCB assembly is heated in a reflow oven to melt the solder in the solder paste thereby forming solder joints; which permanently affix and electrically connect the electronic modules to the PCB. The assembly is then washed to remove the flux residue and tested.

If not carefully removed after the soldering process, traces of the soldering flux residues which remain on the boards can lead to circuit failure. Soldering fluxes fall into three broad categories: rosin fluxes, water-soluble fluxes, and no-clean fluxes. Rosin fluxes, which have a relatively long history of use and are still widely used in the electronics industry, are generally only moderately corrosive. Water-soluble fluxes, which are a more recent development and which are increasingly used in consumer electronics, are highly corrosive materials. No-clean fluxes, a very recent development, reportedly do not require removal from the circuit assemblies. However, residues of any flux are believed to cause circuit failure if residual traces of the material are not carefully removed following soldering and, thus, remain on the electronic circuit assembly. Certain circuit board assemblers even require the removal of no-clean flux residues from circuit boards.

Water-soluble fluxes are relatively easy to remove from electronic circuit assembly substrates by means of water or warm detergent solutions. However, recent SMT has yielded boards having a very high density of components thereon, rendering the cleaning of even water soluble fluxes problematic. A particularly useful cleaner for removing water-soluble flux residues is described in copending, commonly assigned U.S. patent application Ser. No. 08/391,015, filed Feb. 21, 1995, The cleaner disclosed in such application is capable of removing water-soluble fluxes from very densely configured circuit boards and can remove white residues which have also been problematic when using water-soluble fluxes.

Rosin fluxes are difficult to remove. Traditionally, rosin fluxes have been removed from printed circuit boards by means of chlorinated hydrocarbon solvents, mixtures of such solvents or other volatile organic solvent materials. The use of such solvents is disadvantageous in view of the toxicity and environmental problems inherent in such materials and, accordingly, the use of such solvents is in the process of being banned by international treaty or has been subjected to close scrutiny by various government agencies.

To replace these organic solvent materials for use in cleaning rosin flux residues from circuit assemblies, the present assignee has developed the ARMAKLEEN® cleaner which is an aqueous-based cleaner comprising alkali metal salts such as alkali metal carbonate and/or alkali metal bicarbonate salts, alkali metal silicates for use as a corrosion inhibitor as well as organic adjuvants such as surfactants to improve the efficacy of cleaning, anionic polymers to stabilize the silicate in solution as well as hydrotropes to maintain the surfactants in aqueous solution. ARMAKLEE® cleaners are described, for example, in U.S. Pat. Nos. 5,234,505 and 5,234,506, which are hereby incorporated by reference herein. These aqueous-based cleaners have been found to be very effective for removing rosin flux residues and are substantially safer to use relative to the operator and the environment than the previous organic solvent-based cleaners.

Although the above-described aqueous-based cleaners are very effective in removing soldering rosin flux residues from the substrate of an electronic circuit assembly, it is continually desirable to provide improved compositions and methods for removing rosin flux residues from electronic circuit assemblies. In particular, the high SMT component densities make it even more difficult to ensure complete removal of flux residues.

The ARMAKLEEN® cleaners disclosed for example in U.S. Pat. No. 5,431,847 (which is hereby incorporated by reference herein) and in copending, commonly assigned U.S. application Ser. No. 08/417,883, filed Apr. 6, 1995 include nonionic alkoxylate and N-alkylpyrrolidone surfactants either alone, or preferably, in mixtures to enhance cleaning efficacy. While the ARMAKLEEN® aqueous-based cleaners have been shown to be very effective rosin flux removers, it is still desirable to provide such aqueous cleaners with a surfactant formulation which can reduce the surface tension thereof and enhance the flux-removing ability of the cleaner especially in view of the ever increasing component density on the boards.

During the manufacture of electronic circuit assemblies, the boards are plated, etched, handled by operators in assembly, coated with corrosive or potentially corrosive fluxes, and soldered. Thus, contamination other than from fluxes are present. The cleanliness of the electronic circuit assemblies, such as printed circuit boards or printed wiring boards, is generally regarded as being critical to their functional reliability. Accordingly, all ionic and nonionic contamination on a circuit assembly can lead to premature failure of the assembly by allowing short circuits to develop therein.

Fluoro-containing surfactants are known. However, the use of same in purely aqueous cleaners (no organic solvents) and the use of such cleaners to remove rosin flux is not believed to be known. A no-clean soldering flux containing a halide-free, water-soluble activator and a fluorinated surfactant in water is disclosed, e.g., in U.S. Pat. No. 5,297,721 (Schneider et al.). U.S. Pat. Nos. 5,128,057 and 5,308,402 (both to Bixenman et al.) disclose aqueous flux-removing cleaning agents composed of tetrahydrofurfuryl alcohol (THFA) and an amine, ester or ether activator. The patents to Bixenman et al. further disclose the addition of nonionic surfactants to the cleaner including fluorinated surfactants. The Bixenman et al cleaners are an attempt to replace the previously used chlorofluorocarbon solvents (CFCs) to clear circuit boards. While the cleaners of Bixenman are less volatile than CFCs, the presence of THFA in addition to relatively high levels of organic activators would lead to substantial increases in the biological oxygen demand (BOD) and chemical oxygen demand (COD) in waste streams. None of the above patents are directed to aqueous alkaline salt-based cleaners wherein the organic content is limited.

Accordingly, a primary object of this invention is to provide an improved aqueous alkaline salt-based cleaning composition for removing rosin flux residues from a substrate, preferably a substrate of an electronic circuit assembly, wherein the cleaning composition has a reduced surface tension and, thus, improved flux-removing capacity.

A further primary object of the present invention is to provide a method of removing rosin flux residues from a substrate, preferably a substrate of an electronic circuit assembly, by means of a cleaning composition which has a reduced surface tension and, thus, improved flux-removing capacity.

These and other objects which are achieved according to the present invention can be readily discerned from the following description.

SUMMARY OF THE INVENTION

The present invention is based on the discovery that, in an alkaline-salt-based aqueous cleaning composition, the use of a certain surfactant formulation which includes one or more fluorinated surfactants and one or more N-alkylpyrrolidone surfactants provides the composition with a reduced surface tension and, consequently, an improved flux-removing capacity.

Accordingly, one aspect of the present invention is directed to an aqueous cleaning composition containing:

(A) a solvent phase consisting essentially of water; and (B) a flux-removing phase containing an alkaline salt component and a surfactant formulation, the alkaline salt component containing at least one alkali metal salt, and the surfactant formulation containing at least one fluorinated surfactant and at least one N-alkylpyrrolidone surfactant.

Another aspect of the present invention is directed to a method of removing soldering rosin flux residues from a substrate, involving the steps of:

(a) cleaning the substrate with the aqueous cleaning composition of the present invention for a period of time sufficient to substantially emulsify the soldering rosin flux residues to form emulsified rosin flux residues; and (b) removing the emulsified rosin flux residues from the substrate.

The cleaning composition of this invention is preferably formulated as an aqueous concentrate. Upon use, however, the concentrate is preferably diluted with additional water and applied as a cleaning solution onto the substrate to be cleaned. Preferably, the aqueous concentrate and diluted solution are each buffered so as to have a pH of at least about 10.

In preferred embodiments of the cleaning composition of this invention, the alkaline salt component contains one or more alkali metal carbonates or bicarbonates or mixtures thereof.

The flux-removing phase of the cleaning composition of this invention preferably further includes a corrosion inhibitor, most preferably, an alkali metal silicate such as potassium silicate.

The improved cleaning composition of this invention is non-toxic, non-corrosive, and, has improved ability to substantially remove rosin flux residues from substrates containing such residues.

DETAILED DESCRIPTION OF THE INVENTION

The solvent phase of the composition of this invention consists essentially of water. The flux-removing phase of the composition contains an alkaline salt component and a surfactant formulation, wherein the alkaline salt component contains at least one alkali metal salt and the surfactant formulation contains at least one fluorinated, nonionic surfactant and at least one N-alkylpyrrolidone surfactant.

Most suitable alkali metal salts for use in this invention are the salts of potassium, sodium and ammonium, with potassium salts being most preferred. Especially preferred salts are the carbonates and bicarbonates and hydrates thereof, which are economical, safe and environmentally friendly. Preferred carbonate salts include, e.g., potassium carbonate, potassium carbonate dihydrate, potassium carbonate trihydrate, sodium carbonate, sodium carbonate decahydrate, sodium carbonate heptahydrate, sodium carbonate monohydrate, sodium sesquicarbonate and the double salts and mixtures thereof. Preferred bicarbonate salts include potassium bicarbonate and sodium bicarbonate and mixtures thereof.

Other suitable alkaline salts for use in the present invention include, e.g., the alkali metal ortho or complex phosphates. The complex phosphates are especially effective because of their ability to chelate water hardness and heavy metal ions. The complex phosphates include, e.g., sodium or potassium pyrophosphate, tripolyphosphate, and hexametaphosphates. Other suitable alkaline salts include, e.g., the alkali metal borates, acetates, citrates, tartrates, gluconates, succinates, silicates, phosphonates, nitrilotriacetates, edates, and the like.

Most preferably, the alkaline salt component used in the composition of this invention comprises a mixture of potassium and/or sodium carbonate and/or bicarbonate salts.

Generally, the flux-removing phase of the composition of this invention will contain the alkaline salt component in an amount which is sufficient to provide the aqueous composition or the concentrate or solution forms thereof with a pH of preferably at least about 10, more preferably from about 10 to about 13, and most preferably from about 11 to about 13. The desired pH of the composition may depend on the type of flux being removed. Thus, the lower pH range is desirable and effective for removing the more easily removed fluxes. However, a pH of above 11.5 is preferred when removing the more difficult to remove solder paste fluxes. It is most desirable that the alkaline salt component has an adequate reserve of titratable alkalinity, at least equivalent to from about 0.2% to 4.5%, preferably from about 0.6% to 4.5% caustic potash (potassium hydroxide), when titrated to the colorless phenolphthalein end point, which is about a pH of 8.4 to maintain enhanced performance. Typically, the alkaline salt component will be present in an amount ranging from about 45% to about 60% by weight of the flux-removing phase.

The composition of this invention further contains a surfactant formulation which includes at least one fluorinated, nonionic surfactant and at least one N-alkylpyrrolidone surfactant.

Preferably, the fluorinated surfactant for use in the present invention is a fluorinated hydrocarbon. The most preferred fluorinated surfactants for use in the present invention are Zonyl FSO Fluorosurfactant (described as a perfluoroalkyl ethoxylate) available from E. I. DuPont de Nemours & Co., Inc., and Fluorad FC-430 surfactant (described as a fluoroaliphatic polymeric ester) available from the Industrial Chemical Products Division of 3M.

Preferred N-alkylpyrrolidone surfactants for use in this invention are N-(n-alkyl)-2-pyrrolidones wherein the alkyl group contains from about 6 to about 15 carbon atoms. These compounds are described, e.g., in U.S. Pat. No. 5,093,031, which is hereby incorporated by reference herein in its entirety. The most preferred N-alkylpyrrolidone surfactant for use in this invention is N-octylpyrrolidone.

The above N-alkylpyrrolidones having a molecular weight of from about 180 to about 450 are conveniently prepared by several known processes, including the reaction between a lactone having the formula:

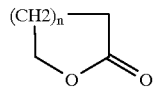

wherein n is an integer from 1 to 3, and an amine having the formula R'—NH$_2$, wherein R' is a linear alkyl group having from 6 to 20 carbon atoms. The amine reactant having the formula R'—NH$_2$ includes alkylamines having from 6 to 20 carbon atoms; amines derived from natural products, such as coconut amines or tallow amines distilled cuts or hydrogenated derivatives of such fatty amines. Also, mixtures of amine reactants can be used in the process for preparing the pyrrolidone compounds. Such mixtures can include linear amino species having an alkyl of the same or different molecular weight. To form the pyrrolidone, the amine and lactone reactants, combined in a mole ratio of from about 1:1 to about 1:5, are reacted under conditions of constant agitation, at a temperature between 100° C. and about 350° C. under a pressure of from atmospheric to about 650 psig for a period of from about 1 to about 15 hours; preferably at 250° C. to 300° C. under an initial ambient pressure for a period of from 5 to 10 hours. The resulting pyrrolidone product is recovered and purified by distillation or by any other convenient recovery process.

The N-alkylpyrrolidone products having 11 to 14 carbon atoms are clear, water white liquids, at room temperature; whereas those having 16 or more carbon atoms are solids. These pyrrolidones have a neutral or slightly basic pH, a surface tension of between about 25 and about 35 dynes/cm as a 0.1% water solution and a viscosity of from about 6 to about 30 cps at 25° C.

Generally, the $C_6$ to $C_{14}$ alkyl pyrrolidones display primarily surfactant properties; whereas the $C_{16}$ to $C_{22}$ alkyl species are primarily complexing agents; although some degree of surfactant and complexing capability exists in all of the present species. One particular advantage of the alkyl pyrrolidone surfactants is the additional detergency that these surfactants provide to the compositions of this invention.

The amount of the surfactant formulation (including fluorinated surfactant, N-alkylpyrrolidone surfactant, and any antifoam agents discussed hereinbelow) used in the composition of this invention will preferably be no more than about 20%, and preferably from about 2% to about 20%, by weight of the composition but can be varied depending on the conditions and contamination encountered. Preferably, the composition of this invention will contain from about 0.01% to about 5%, more preferably from about 0.01% to about 1.0%, and most preferably from about 0.05% to about 0.5%, by weight of the fluorinated surfactant. In addition, the composition will contain the N-alkylpyrrolidone surfactant in an amount ranging from about 0.1% to about 5.0%, more preferably from about 0.5% to about 2.0%, and most preferably from about 1.0% to about 1.5% by weight.

The cleaning composition used in the present invention preferably further contains at least one antifoam agent. The antifoam agent prevents the formation of excessive foam caused by the combination of rosin flux and the aqueous composition of this invention. The presence of foam interferes with the mechanical action of the cleaning equipment used to wash the circuit boards. It is important, if not critical, that the antifoam agent(s) used herein does not act by replacing the flux film with another residual surface film which could affect the performance of the electronic circuit assembly in use. The antifoam agent could be an agent which solely acts to inhibit foam or it could be a surfactant which helps clean the boards and emulsify soils such as the nonionic Polytergent SLF-18 or Surfonic LF37 described hereinabove.

The antifoam agent(s) which can be used in the present invention may be an agent which solely acts to inhibit foam or may be a surfactant which helps clean the electronic circuit assembly substrate and emulsify soils.

Examples of preferred antifoam agents which can be used in the present invention include those disclosed in U.S. Pat. No. 5,234,505, which has been previously incorporated by reference herein. Such compounds include those formed by condensing ethylene oxide with a hydrophobic base formed by the condensation of propylene oxide with propylene glycol. Examples of suitable antifoam agents include the "Pluronics" agents sold by BASF-Wyandotte. These compounds also enhance flux removal.

Other antifoam agents that also enhance flux removal include: the polyethylene oxide/polypropylene oxide condensates of alkyl phenols having an alkyl group containing from about 6 to about 12 carbon atoms in either a straight chain or branched chain configuration, with ethylene oxide/propylene oxide, the ethylene oxide being present in amounts equal to 1 to 25 moles of ethylene oxide per mole of alkyl phenol and the propylene oxide being present in amounts equal to 1 to 25 moles of propylene oxide per mole of alkyl phenol. The alkyl substituent in such compounds may be derived from, e.g., polymerized propylene, diisobutylene, octene or nonene.

Other suitable antifoam agents include those derived from the condensation of ethylene oxide with the product resulting from the reaction of propylene oxide and ethylenediamine or from the product of the reaction of a fatty acid with sugar, starch or cellulose. The antifoam agent may be the condensation product of aliphatic alcohols having from 8 to 18 carbon atoms, in either straight chain or branched chain configuration, with ethylene oxide and propylene oxide.

In the aqueous concentrate formulation of the cleaning composition of this invention, the antifoam agent(s) is preferably present in an amount ranging from about 0.01% to 0.5% by weight of the concentrate.

It may be useful to include a hydrotrope in the aqueous cleaning composition of this invention to help solubilize any organic adjuvants such as surfactants, anti-foam agents, and the like, which are present in the salt-containing compositions. Optimally, the hydrotrope will be present in the aqueous concentrate formulation of the aqueous composition of this invention in an amount which does not exceed about 3% by weight, and preferably ranges from about 0.2% to about 3% by weight of the concentrate.

Hydrotropes suitable for use in this invention include those disclosed in U.S. Pat. No. 5,234,505, which has previously been incorporated by reference herein. Preferred hydrotropes include the alkali metal salts of intermediate chain length monocarboxylic fatty acids, i.e., $C_7$–$C_{13}$. Specifically, preferred hydrotropes which can be used in the present invention include the sodium, potassium, ammonium and alkanol ammonium salts of xylene, toluene, ethylbenzoate, isopropylbenzene, naphthalene, alkyl naphthalene sulfonates, phosphate esters of alkoxylated alkyl phenols, phosphate esters of alkoxylated alcohols and sodium, potassium and ammonium salts of the alkyl sarcosinates. The hydrotropes are useful in maintaining the organic materials including the surfactant readily dispersed in the aqueous cleaning solution and, in particular, in an aqueous concentrate which is an especially preferred form of packaging the compositions of the invention and allow the user of the compositions to accurately provide the desired amount of cleaning composition into the aqueous wash solution. A particularly preferred hydrotrope is one that does not foam. Among the most useful of such hydrotropes are those which comprise the alkali metal salts of intermediate chain length linear monocarboxylic fatty acids, i.e., $C_7$–$C_{13}$. Particularly preferred are the alkali metal octanoates and nonanoates.

The hydrotropes are preferably present in the composition in amounts of from about 0% to about 20% by weight, more preferably, from about 5% to about 15% by weight.

As mentioned hereinabove, the cleaning composition of this invention preferably includes a corrosion inhibitor, preferably an alkali metal silicate, which is added to provide improved anti-corrosion protection to the electronic circuit assembly as well as to ensure bright metallic surfaces including the solder joints as well as any connecting tabs and the like. Thus, any of the lithium, sodium or potassium silicates are useful in the cleaning compositions of this invention. Preferably, however, the sodium or potassium silicates are used and, most preferably, potassium silicate is used. The alkali metal silicates which are used can be in a variety of forms which can be encompassed generally by the formula $M_2O:SiO_2$ wherein M represents the alkali metal and in which the ratio of the two oxides can vary. Most useful alkali metal silicates will have an $M_2O$ to $SiO_2$ mole ratio of between 1:1.5 and 1:4.5. Most preferably, the $M_2O:SiO_2$ ratio is between 1:1.6 and 1:4.0. Such silicates also provide additional alkalinity to the wash water to help cleaning.

The corrosion inhibitor will be present in the cleaning composition of this invention in amounts ranging from about 0.1% to 10% by weight, based on the flux-removing phase. The corrosion inhibitor, preferably, the alkali metal silicate, and, most preferably, potassium silicate, can be added to the flux-removing phase and added to the wash bath or, preferably, is added with the flux-removing phase in aqueous solution to form the aqueous concentrate.

A drawback to the use of alkali metal silicates in aqueous solutions having relatively low pH levels is that silicate tends to precipitate from the aqueous solution.

The silicate may be stabilized and maintained in solution by adding an anionic polymer to the solution. Suitable anionic polymers are disclosed, e.g., in U.S. Pat. Nos. 5,234,505 and 5,431,847, which have previously been incorporated by reference herein. Particularly preferred anionic polymers are those containing carboxylate groups.

In general, anionic homopolymers or copolymers with molecular weights of between about 1000 to about 5,000,000 or mixtures thereof are usefully employed in this invention as silicate stabilizers. However, the optimal polymers are ones which dissolve easily and do not increase the viscosity of the solutions to excessive levels when added at the concentration required for optimum silicate stability.

The following anionic polymers are non-inclusive examples of those suitable for stabilizing silicate solutions: carboxymethylcellulose, polyacrylic acid, polymethacrylic acid, polymaleic acid, polyglycolic acid, heteropolymers of acrylic and methacrylic acid, xanthan gum, carrageenan gum, and alginate gum. In the alkaline solutions of this invention, the anionic polymers are essentially present in the form of the sodium or potassium salt thereof. Additional alkali can be added to neutralize the polymers.

A preferred silicate stabilizing agent is a high molecular weight polyacrylic acid such as in the form of sodium polyacrylate in solution. This polyacrylate should have a molecular weight of between about 100,000 to about 4,000,000, preferably from over 150,000 to 4,000,000. An especially preferred molecular weight range is about 250,000 to about 2,000,000. Examples of such polymers are marketed under the tradename "Carbopol", from B.F. Goodrich.

The polyacrylic acid stabilizers have been found to be very effective in maintaining the alkali metal silicate in solution, in particular, when the composition is in the form of an aqueous concentrate as hereinbefore defined. Accordingly, relatively small amounts of the anionic polymer are effective. Thus, at silicate concentrations of from about 0.5% to about 10.0% by weight in the cleaning concentrate, amounts of the polyacrylic acid needed for stabilization range from about 0.1% to about 2% by weight.

For the removal of rosin soldering flux deposits and other residues during printed circuit/wiring board fabrication, the aqueous cleaning composition of this invention is generally formulated either in the form of a concentrate or a dilute solution. Preferably, the cleaning composition of the present invention is prepared as an aqueous concentrate. The concentrate preferably contains from about 5% to about 45% by weight of the flux-removing phase and from about 55% to about 95% by weight of the solvent phase. More preferably, the concentrate contains from about 10% to about 30% by weight of the flux-removing phase and from about 70% to about 90% by weight of the solvent phase. Most preferably, the concentrate contains from about 15% to about 20% by weight of the flux-removing phase and from about 80% to about 85% by weight of the solvent phase.

As an aqueous dilute solution, the cleaning composition of this invention will preferably contain from about 0.5% to about 10% by weight, more preferably from about 0.9% to about 5% by weight, and most preferably from about 1% to about 3% by weight, of the flux-removing phase; and from about 90% to about 99.5% by weight, more preferably from about 95% to about 99.1% by weight, and most preferably from about 97% to about 99% by weight, of the solvent phase.

The specific amount of water added to the concentrate to form the dilute solution formulation of the composition of this invention will vary according to factors relating to manufacturing, packaging, shipping, and storage.

In the present invention, additives, adjuvants and the like may be included with the flux-removing phase, the aqueous concentrate formulation or the aqueous solution formulation of the composition of this invention.

In general, the cleaning process for removing flux residues is a continuous process. In such process, the circuit assemblies are deposited on a conveyor assembly which traverses one or more cleaning stations and one or more rinsing stations. Each cleaning and rinsing station is a tank or other similar receptacle wherein the conveyor assembly containing the assemblies is immersed and then withdrawn to drain excess solution from the assemblies. In either the cleaning bath or rinse bath, the cleaning solution or rinse water can be applied by spray nozzles within the respective wash or rinse tanks. Subsequent to final rinsing, the conveyor assembly is then withdrawn from the tank and the circuit assemblies removed from the conveyor system which is then recycled to carry more circuit assemblies through the cleaning process.

For the removal of rosin soldering flux deposits and other residues during printed circuit/wiring board fabrication, the aqueous cleaning composition of this invention, either in the form of a concentrate or a solution, may be applied to the boards by immersion in dip tanks or by hand or mechanical brushing. Alternatively, the aqueous concentrate or dilute solution may be applied by any of the commercially available printed wiring board cleaning equipment. Dishwasher size units may be used, or much larger cleaning systems such as the "Poly-Clean +" and the various "Hydro-Station" models produced by Hollis Automation, Inc. of Nashua, N.H.

Depending upon their design, these washers may apply the concentrate or solution by spraying with mechanical nozzles or by rolling contact with wetted roller surfaces. The temperature at which the concentrate or solution may be applied can range from ambient temperature (about 70° F.) to about 180° F., preferably, about 140° F. to 170° F.

Once solder flux has been loosened and removed during a period of contact which typically ranges from about 1 to about 5 minutes, but may be longer up to about 10 minutes, the boards are taken from the concentrate or solution. Another advantage of the instant invention is that the aqueous cleaning composition need not be flushed with solvents as with the processes of the prior art. Herein, the boards may simply be flushed with water for a period of up to about 2 minutes. Deionized water is preferred. The optimal rinsing time varies according to the kinds of surfactants and the concentrations of the aqueous cleaning compositions used and can easily be determined by routine experimentation.

The cleaned boards are then dried, preferably with forced air. Drying is expedited if the air is warmed, preferably to above about 100° F.

The aqueous cleaning composition of this invention is also effective in removing other undesirable and deleterious substances and residues. Such substances and residues include, for example, non-rosin flux, photoresist, solder masks, adhesives, machine oils, greases, silicones, lanolin, mold release, polyglycols, and plasticizers.

What is claimed is:

1. A method of removing soldering rosin flux residues from a substrate, comprising the steps of:

(a) cleaning said substrate with an aqueous cleaning composition for a period of time sufficient to substantially emulsify the soldering rosin flux residues to form emulsified rosin flux residues; and (b) removing said emulsified rosin flux residues from said substrate;

said aqueous cleaning composition comprising:

(A) a solvent phase consisting essentially of water; and
   (B) a flux-removing phase comprising an alkaline salt component and a surfactant formulation, said alkaline salt component containing at least one alkali metal salt, and said surfactant formulation containing at least one fluorinated surfactant and at least one N-alkylpyrrolidone surfactant.

2. A method according to claim 1, wherein said at least one alkali metal salt is an alkali metal carbonate salt or hydrate thereof or an alkali metal bicarbonate salt or hydrate thereof.

3. A method according to claim 2, wherein said alkali metal carbonate salt is a potassium carbonate salt or a sodium carbonate salt, and said alkali metal bicarbonate salt is a potassium bicarbonate salt or a sodium bicarbonate salt.

4. A method according to claim 1, wherein said fluorinated surfactant is a perfluoro ethoxylate or a fluoroaliphatic polymeric ester.

5. A method according to claim 1, wherein said N-alkylpyrrolidone surfactant is an N-(n-alkyl)-2pyrrolidone having an alkyl group containing from 6 to 15 carbon atoms.

6. A method according to claim 1, wherein said composition comprises from about 2% to about 20% by weight of said surfactant formulation.

7. A method according to claim 1, wherein said composition comprises from about 0.01% to about 5% by weight of said fluorinated surfactant and from about 0.1% to about 5% by weight of said N-alkylpyrrolidone surfactant.

8. A method according to claim 1, wherein said composition has a pH of at least about 10.

9. A method according to claim 1, wherein said composition is in concentrate form, said concentrate comprising from about 5% to about 45% by weight of said flux-removing phase and from about 55% to about 95% by weight of said solvent phase.

10. A method according to claim 1, wherein said composition is in dilute solution form, said dilute solution comprising from about 0.5% to about 10% by weight of said flux-removing phase and from about greater than about 90% to about 99.5% by weight of said solvent phase.

* * * * *